United States Patent
McKnight-MacNeil et al.

(10) Patent No.: US 9,589,868 B2
(45) Date of Patent: Mar. 7, 2017

(54) PACKAGING SOLUTIONS FOR DEVICES AND SYSTEMS COMPRISING LATERAL GaN POWER TRANSISTORS

(71) Applicant: GaN Systems Inc., Ottawa (CA)

(72) Inventors: Cameron McKnight-MacNeil, Nepean (CA); Greg P. Klowak, Ottawa (CA); Ahmad Mizan, Kanata (CA)

(73) Assignee: GaN Systems Inc., Ottawa (CA)

( * ) Notice: Subject to any disclaimer, the term of this patent is extended or adjusted under 35 U.S.C. 154(b) by 0 days.

(21) Appl. No.: 15/064,750

(22) Filed: Mar. 9, 2016

(65) Prior Publication Data

US 2016/0268190 A1  Sep. 15, 2016

Related U.S. Application Data

(60) Provisional application No. 62/131,293, filed on Mar. 11, 2015.

(51) Int. Cl.
*H01L 23/00* (2006.01)
*H01L 23/495* (2006.01)
(Continued)

(52) U.S. Cl.
CPC ...... *H01L 23/49503* (2013.01); *H01L 21/565* (2013.01); *H01L 21/78* (2013.01);
(Continued)

(58) Field of Classification Search
CPC ......... H01L 23/49575; H01L 2224/245; H01L 2224/37147; H01L 24/32; H01L 2924/1033; H01L 24/83; H01L 23/4952
See application file for complete search history.

(56) References Cited

U.S. PATENT DOCUMENTS

2012/0217616 A1* 8/2012 Matsuoka ............. H01L 23/495
257/532
2012/0228696 A1* 9/2012 Carpenter ......... H01L 23/49575
257/329
(Continued)

FOREIGN PATENT DOCUMENTS

WO  2012103633 A1  8/2012
WO  2015061881 A1  5/2015

OTHER PUBLICATIONS

He, Ate et al.; "All-Copper Chip-to-Substrate Interconnects Part II. Modeling and Design", J. Electrochem. Soc., 155(4) D314-D322 (2008).
(Continued)

*Primary Examiner* — Ngan Ngo
(74) *Attorney, Agent, or Firm* — Miltons IP/p.i.

(57) ABSTRACT

Packaging solutions for large area, GaN die comprising one or more lateral GaN power transistor devices and systems are disclosed. Packaging assemblies comprise an interposer sub-assembly comprising the lateral GaN die and a leadframe. The GaN die is electrically connected to the leadframe using bump or post interconnections, silver sintering, or other low inductance interconnections. Then, attachment of the GaN die to the substrate and the electrical connections of the leadframe to contacts on the substrate are made in a single process step. The sub-assembly may be mounted in a standard power module, or alternatively on a substrate, such as a printed circuit board. For high current applications, the sub-assembly also comprises a ceramic substrate for heat dissipation. This packaging scheme provides interconnections with lower inductance and higher current capacity, simplifies fabrication, and enables improved thermal matching of components, compared with conventional wirebonded power modules.

19 Claims, 14 Drawing Sheets

(51) Int. Cl.
*H01L 23/31* (2006.01)
*H01L 21/56* (2006.01)
*H01L 21/78* (2006.01)
*H01L 23/498* (2006.01)
*H01L 23/492* (2006.01)
*H01L 23/482* (2006.01)

(52) U.S. Cl.
CPC ...... *H01L 23/3107* (2013.01); *H01L 23/4824* (2013.01); *H01L 23/492* (2013.01); *H01L 23/4952* (2013.01); *H01L 23/49524* (2013.01); *H01L 23/49562* (2013.01); *H01L 23/49575* (2013.01); *H01L 23/49861* (2013.01); *H01L 24/17* (2013.01); *H01L 24/32* (2013.01); *H01L 24/33* (2013.01); *H01L 24/73* (2013.01); *H01L 24/81* (2013.01); *H01L 24/83* (2013.01); *H01L 24/92* (2013.01); *H01L 24/97* (2013.01); *H01L 2224/13147* (2013.01); *H01L 2224/16245* (2013.01); *H01L 2224/245* (2013.01); *H01L 2224/29139* (2013.01); *H01L 2224/32225* (2013.01); *H01L 2224/32245* (2013.01); *H01L 2224/33181* (2013.01); *H01L 2224/37147* (2013.01); *H01L 2224/73203* (2013.01); *H01L 2224/81191* (2013.01); *H01L 2224/81801* (2013.01); *H01L 2224/8384* (2013.01); *H01L 2224/83801* (2013.01); *H01L 2224/92143* (2013.01); *H01L 2924/01014* (2013.01); *H01L 2924/04642* (2013.01); *H01L 2924/1033* (2013.01); *H01L 2924/13064* (2013.01); *H01L 2924/13091* (2013.01); *H01L 2924/17747* (2013.01)

(56) References Cited

U.S. PATENT DOCUMENTS

| | | | |
|---|---|---|---|
| 2014/0061884 A1* | 3/2014 | Carpenter | H01L 23/49524 257/676 |
| 2014/0175628 A1* | 6/2014 | Pan | H01L 24/37 257/676 |
| 2014/0264804 A1* | 9/2014 | Terrill | H01L 23/4824 257/676 |
| 2015/0001692 A1* | 1/2015 | Tsai | H01L 23/49562 257/666 |
| 2015/0162252 A1 | 6/2015 | Klowak et al. | |
| 2016/0240471 A1* | 8/2016 | Klowak | H01L 23/4824 |
| 2016/0247748 A1* | 8/2016 | Kinzer | H01L 23/49524 |
| 2016/0285418 A1* | 9/2016 | Jones | H03F 1/0205 |

OTHER PUBLICATIONS

Lee, Han S.; "GaN-on-Silicon-Based Power Switch in Sintered, Dual-Side Cooled Package", Power Electronics, Jan. 2, 2013; 10 pages.
Yannou, Jean-Marc et al.; "Analysis of innovation trends in packaging for power modules", 7th European Advance Technology Workshop on Micropackaging and Thermal Management, IMAPS 2012, Feb. 1-2, 2012; 33 pages.
Patterson, Deborah S.; "2.5/3D Packaging Enablement through Copper Pillar Technology", Chip Scale Review, May-Jun. 2012; pp. 20-26.
Amkor Technology Inc.; "3D Bondwire Electrical Modeling Results" 2001; pp. 1-3.

* cited by examiner

500

601

PACKAGING SOLUTIONS FOR DEVICES AND SYSTEMS COMPRISING LATERAL GAN POWER TRANSISTORS

CROSS-REFERENCE TO RELATED APPLICATIONS

This application claims priority from United States Provisional patent application No. 62/131,293, filed Mar. 11, 2015, entitled "PACKAGING SOLUTIONS FOR DEVICES AND SYSTEMS COMPRISING LATERAL GaN POWER TRANSISTORS", which is incorporated herein by reference in its entirety.

This application is related to U.S. Provisional patent application No. 62/131,308, filed Mar. 11, 2015, entitled "PACKAGING SOLUTIONS FOR DEVICES AND SYSTEMS COMPRISING LATERAL GaN POWER TRANSISTORS", which is incorporated herein by reference in its entirety.

TECHNICAL FIELD

The present invention is related to packaging solutions for devices and systems comprising large area, lateral Gallium Nitride (GaN) power transistors and other high current/high voltage nitride semiconductor devices.

BACKGROUND

GaN devices are expected to be widely adopted for power switches as production costs are reduced, for example, by fabrication of lateral GaN transistors on lower cost silicon substrates (GaN-on-Si die). Lateral GaN power transistors offer low on-resistance $R_{on}$ and high current capability per unit active area of the device. To benefit from the inherent performance characteristics of lateral GaN transistors, important design considerations include, for example, device layout (topology), low inductance packaging and effective thermal management.

For larger area lateral switching power transistors capable of switching 20 Amps or more, using conventional device topologies, where large area contact pads are provided around the periphery of the chip, the length of conductive tracks of on-chip metallization becomes very long. The resistance of the on-chip metallization can be comparable to, or even greater than, the $R_{on}$ of the transistor itself. Furthermore, these long tracks introduce inductance, which significantly degrades the switching performance.

Correspondingly, much energy is wasted, which goes simply to heating or overheating of the track. This tends to put an upper limit on the practical size of such power transistors. PCT International patent application No. PCT/CA2012/000080 entitled "Gallium nitride power devices using island topography", (GaN Systems Inc.), and related applications, disclose GaN switching devices using Island Technology®. This topology for lateral GaN transistors mitigates this problem by providing the ability to take high current directly on and off the chip to/from each island, thus minimizing the length of the on-chip tracks. That is, contact areas are distributed over the active area of the device. This topology provides a low on resistance ($R_{on}$), low inductance, and a compact structure with a gate width double that of a conventional multi-finger design of a similar device size, with superior current handling per unit area. A breakdown voltage exceeding 1200V can be achieved.

Another large area, multi-island, transistor structure is disclosed in PCT International application No. PCT/CA2014/000762 and U.S. patent application Ser. No. 14/568,507, each entitled "Fault Tolerant Design for Large Area Nitride Semiconductor Devices" (GaN Systems Inc.), which claim priority from U.S. Provisional Patent application No. 61/896,871, filed 29 Oct. 2013. These patent applications disclose redundant-cell, yield enhancement techniques, providing a practical approach, which allows for manufacturing of larger dies. For example, large gate width devices may be fabricated having a current switching capability in excess of 100 A.

To take advantage of these novel structures and other large area, lateral GaN power devices for high voltage/high current applications, improved interconnect and packaging schemes are required. Packaging solutions are required that offer both low inductance interconnections and effective thermal management.

Packaging solutions currently used for power devices typically comprise one of two main types of structures. Firstly, there are a number of industry standard power modules for packaging one or more power devices that are based on conventional wirebond solutions for bare die. For example, the back-side (substrate) of a semiconductor die comprising a power transistor is mounted on a thermal substrate of a power module, using conventional back-side die-attach techniques, soldering or sintering. Then, source, drain and gate connections between the contact pad areas on the front-side of the die and the metal contact areas of the packaging module are then made by conventional wirebonding. External connections of the packaging module may comprise various standard arrangements of pins or leads.

Alternatively, there are many variants of PQFN (Power Quad Flat No Lead) type packages. These packages typically comprise organic or ceramic substrates, which provide external metal contact pads, e.g. copper lands, instead of leads or pins. For packaging of vertical power devices, where source or drain contacts may be provided on the back-side of the GaN die, PQFN packages provide a copper die pad and may use wirebonds, copper clips, or flip-chip on leadframe interconnections. For example, some PQFN packages use a copper clip to hold the power transistor die in place and provide thermal contact with a thermal substrate.

For lateral GaN power devices, some known drawbacks of these existing packaging solutions include, e.g.:
- a conventional PQFN package for vertical power transistors provides a back-side source connection, and front-side drain and gate connections, whereas for lateral GaN power transistors, all electrical connections, i.e. source, drain and gate contact areas are made to the front-side (top) of the GaN die;
- such PQFN packages are not configured to provide a ground connection between a front-side source contact and the die substrate/thermal pad within the package;
- for lateral GaN power transistors, electrical issues of wirebonding include insufficient current handling and excessive inductance of the long thin lengths of wirebonds;
- wirebonding solutions may require many layers of wirebonds and take up significant space, i.e. tend to be large in the vertical dimension (tall/thick/high profile), which places physical limitations on the design of power modules;
- there is a significant mismatch of CTE (Coefficient of Thermal Expansion) between a GaN-on-Si die and the copper die pad of standard PQFN package or the ceramic substrate of a power module;

the copper die pad of a standard PQFN package adds extra thermal resistance compared to a bare die on a ceramic substrate of a conventional wirebonded power module.

Thus, there is a need for alternative packaging solutions and/or improvements that provide for one or more of increased current handling, reduced inductance, improved thermal management, and a lower profile package, which can be manufactured at a cost that is similar to, or lower than, existing packaging solutions.

In particular, there is a need for alternative or improved packaging schemes for nitride power semiconductor devices, such as GaN power transistors and for systems comprising one or more lateral GaN power transistors.

SUMMARY OF INVENTION

The present invention seeks to provide alternative or improved packaging for nitride semiconductor devices, such as GaN power transistors and systems using one or more lateral GaN power transistors.

Aspects of the invention provide a semiconductor device structure comprising a lateral GaN power transistor and packaging components, an interposer sub-assembly and a method of fabricating a semiconductor device structure.

One aspect of the invention provides semiconductor device structure comprising an assembly of:
a lateral GaN power transistor fabricated on a semiconductor substrate (GaN die) and packaging components comprising a leadframe and a substrate;
the GaN die comprising a front surface providing source, drain, and gate contact areas for the lateral GaN power transistor and a back surface for die-attach;
the leadframe comprising a copper leadframe patterned to provide source, drain, and gate portions corresponding to source, drain, and gate contact areas on the front surface of the GaN die;
the source, drain, and gate contact areas of the GaN die being attached with electrical interconnections connected to respective source, drain, and gate portions of one side of the first copper leadframe comprising low inductance connections, to form an interposer sub-assembly;
source, drain, and gate leads of the leadframe extending laterally and vertically from the GaN die to provide source, drain, and gate leads providing contact surfaces coplanar with the die-attach surface of the GaN die for electrical interconnection to respective coplanar contact areas of the substrate; and
the die-attach between the back-side surface of the GaN die and the respective source, drain, and gate interconnections being made by a layer interconnect material, which is electrically and thermally conductive.

In one embodiment, the low inductance interconnections preferably comprise a plurality of solder-tipped copper pillars. In other embodiments, the die attach and low inductance connections comprise a layer of interconnect material, e.g. a layer of soldered or sintered material, such as, sintered silver, or brazed copper, or other material that has excellent electrical and thermal conductivity.

In one embodiment, the substrate comprises a ceramic substrate of a power module for thermal dissipation, the ceramic substrate being metallized on both sides to providing coplanar source, drain, and gate contact areas on one side, together with a coplanar die-attach area.

In another embodiment, the substrate comprises a Printed Circuit Board (PCB) providing coplanar source, drain, and gate contact areas and a coplanar die-attach area of the PCB, and wherein the die-attach area of the PCB provides for thermal dissipation.

The GaN die may comprise a silicon substrate or silicon carbide substrate.

The low inductance connections may comprise, for example, one of: a layer of sintered silver; metal bump or post connections; solder tipped copper posts, or a combination thereof.

The back surface of the GaN die is attached to the die-attach area of the substrate, e.g. by a layer of sintered silver, and the source, drain, and gate interconnections from the leadframe to the substrate may comprise solder.

The interposer sub-assembly comprises the GaN die and leadframe and further comprises a thermal dissipation layer. For example, the GaN die is attached to said one side of the leadframe and the thermal dissipation layer comprises a ceramic substrate attached to an opposite side of the leadframe. The ceramic substrate may support leadframe components providing individual source, drain, and gate leads.

The device structure may comprise a second lateral GaN die or other semiconductor die co-packaged and electrically interconnected with the said GaN die.

Another aspect of the invention provides an interposer sub-assembly of a GaN die and a leadframe for the device structure, wherein the GaN die is electrically connected to contact areas on one side of the leadframe, and the leadframe provides source, drain, and gate contact areas coplanar with a back-side die-attach surface of the GaN die.

For example, the interposer sub-assembly comprises a GaN die, a leadframe and a thermal substrate, wherein the leadframe is sandwiched between the GaN die and the thermal substrate, the GaN die being electrically connected to contact areas on one side of the leadframe and the thermal substrate being bonded to an opposite side of the leadframe for thermal dissipation, and the leadframe provides source, drain, and gate contact areas coplanar with a back-side die-attach surface of the GaN die.

In an embodiment, the leadframe comprises brazed copper and the thermal substrate comprises a ceramic thermal substrate bonded to the brazed copper leadframe, and the GaN die-attach is electrically and thermally bonded to the leadframe by a sintered silver layer.

A second thermal substrate may be bonded to the back surface of the GaN die and the second thermal substrate provides said die-attach surface of the GaN die. An electrically and thermally conductive material is used for die-attach, so that in addition to thermal dissipation, a source connection can be made to the die substrate.

Another aspect of the invention provides a method of fabricating a semiconductor device structure comprising an assembly of: a lateral GaN power transistor fabricated on a semiconductor substrate (GaN die) and packaging components comprising a substrate, the method comprising:
providing the GaN die comprising on a front surface thereof source, drain, and gate contact areas for the lateral GaN power transistor and a back surface thereof for die-attach;
providing a copper leadframe, the leadframe being patterned to provide source, drain, and gate portions corresponding to source, drain, and gate contact areas on the front surface of the GaN die;
attaching the source, drain, and gate contact areas of the GaN die with electrical interconnections connected to respective source, drain, and gate portions of one side of the first copper leadframe comprising a low inductance material to form an interposer sub-assembly;

source, drain, and gate leads of the leadframe extending laterally and vertically from the GaN die to provide source, drain, and gate leads providing contact surfaces coplanar with the die-attach surface of the GaN die for electrical interconnection to respective coplanar contact areas of the substrate; and providing a layer of soldered or sintered material which is electrically and thermally conductive to attach the back-side surface of the GaN die to the die-attach area of the substrate, and electrically interconnect the respective source, drain, and gate interconnections of the leadframe and substrate contact areas.

The method may comprise providing a low inductance material comprising a sintered metal such as silver, or metal bumps or posts. A preferred material is solder tipped copper posts. Processing comprises performing sintering or reflow or other processing of the bump or post connections or the attachment material, to vertically attach, and thermally and electrically interconnect the source, drain, and gate contact areas of the GaN die and respective source, drain, and gate portions.

In some embodiments, the method further comprises providing a package body comprising an over-molding of encapsulation.

In some embodiments, multiple chips may be mounted on a common substrate. For example, two GaN chips packaged as described above, may be mounted side-by-side on a common substrate, and interconnected to form a half-bridge circuit, and/or GaN chips may be co-packaged with a driver or pre-driver chip, and/or comprise integrated driver components.

Thus, alternative or improved packaging and interconnect structures are provided for nitride semiconductor devices, such as GaN power transistors and systems using one or more lateral GaN power transistors.

BRIEF DESCRIPTION OF THE DRAWINGS

In the drawings, identical or corresponding elements in the different Figures have the same reference numeral, or corresponding elements have reference numerals incremented by 100 in successive Figures.

The foregoing and other features, aspects and advantages of the present invention will become more apparent from the following detailed description, taken in conjunction with the accompanying drawings, of preferred embodiments of the invention, which description is by way of example only.

DETAILED DESCRIPTION OF EMBODIMENTS

Embodiments of the present invention are described, which provide packaging solutions for large area GaN dies comprising lateral GaN power transistors.

Figure 1:
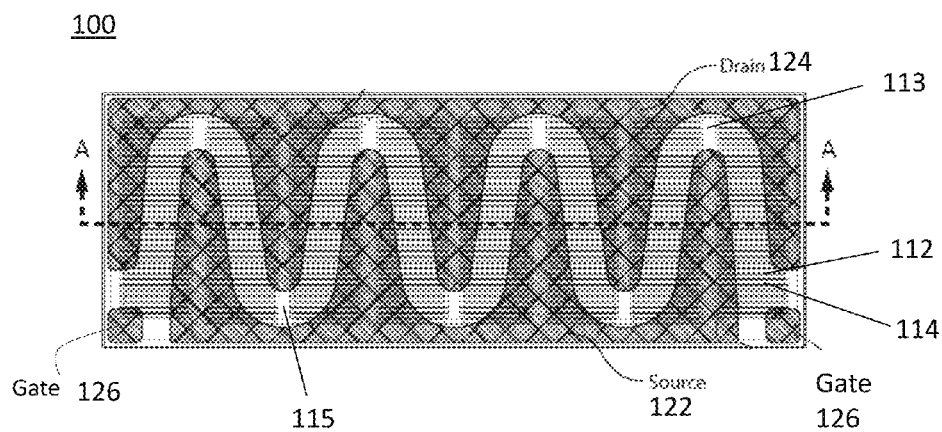
FIG. 1 shows a schematic front-side (top) view of the layout of an exemplary large gate width, lateral GaN power transistor die, showing large area source, drain and gate contact areas; underlying source, drain and gate electrodes; and interconnect metallization.
Figure 2:
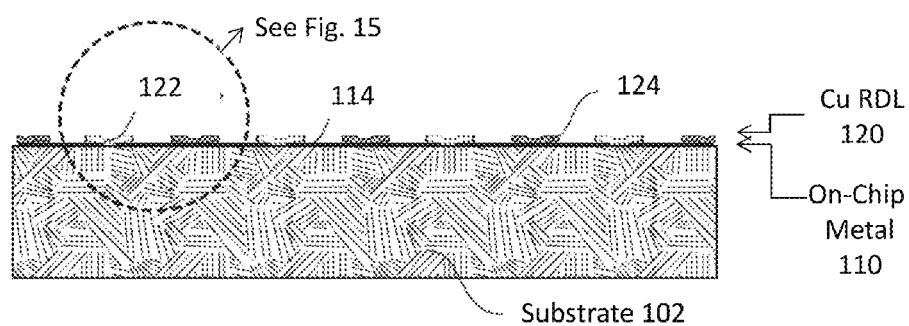
FIG. 2 shows a schematic cross-sectional view through line A-A of FIG. 1.
Figure 3:
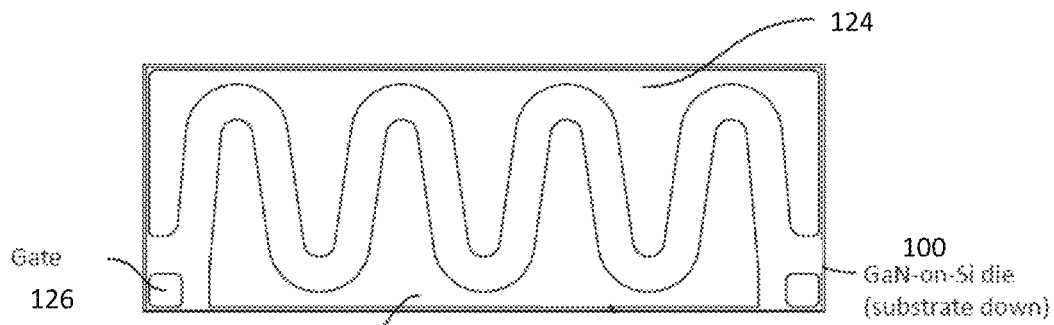
FIG. 3 shows a simplified schematic front-side view of FIG. 1.

FIGS. 1 to 3 illustrate schematically an exemplary large area, large gate width, lateral GaN power transistor die. FIG. 1 shows a schematic front-side view of the layout of the lateral GaN power transistor die 100, in which the layers are rendered with some transparency to show the structure of underlying layers, i.e.: a top layer defining large area source 122, drain 124 and gate 126 contact areas; underlying source electrodes 112 and drain electrodes 114; and an intervening layer of on-chip interconnect metallization defining source straps or interconnections 113 and drain straps or interconnections 115. The GaN transistor comprises a plurality of active areas or islands, comprising interdigitated/interleaved source and drain electrodes 112 and 114, with gate electrodes (not visible) running between the adjacent source and drain electrodes. The source electrodes 112 are electrically interconnected in parallel by the low resistance metal straps 113 defined by on-chip metallization, and the drain electrodes 114 are similarly electrically interconnected in parallel by the low resistance metal straps 115 defined by the on-chip metallization. An overlying relatively thick layer of metal, which in this embodiment comprises a Copper Redistribution Layer (Cu RDL), is formed thereon and patterned to form large area electrodes or contact areas, comprising a source portion 122 and a drain portion 124, corresponding to the arrangement of the source and drain contact areas of the underlying on-chip metal. The source portion of the Cu RDL 122 connects the underlying source metal straps 113 in parallel and the drain portion of the Cu RDL 124 connects the underlying drain metal straps 115 in parallel. The Cu RDL also provides gate contact areas 126 for the underlying gate electrodes. FIG. 2 shows a schematic cross-sectional view through line A-A of FIG. 1, to show the relatively thick Cu RDL 120 forming the large area source electrodes 122 and drain electrodes 124, which contact the underlying on-chip metal 110 of the source and drain, e.g. drain metal 114, to form respective source and drain interconnections.

FIG. 3 shows a simplified schematic front-side view of the lateral GaN die of FIG. 1, showing schematically the patterning of the Cu RDL defining the large area source and drain contact areas 122 and 124, and the gate contact areas 126, of the front-side of GaN die 100. This structure will be used as an example in describing packaging assemblies according to embodiments of the present invention. The thick Cu RDL layer provides low inductance interconnections which support the lateral current handling of the on-chip metal as well as providing interconnect contact areas (pad sizes) of sufficient size to match leadframe specifications.

Examples of three prior art packages will first be described with reference to FIGS. 4, 5A and 5B, and 6A and 6B.

Figure 4:
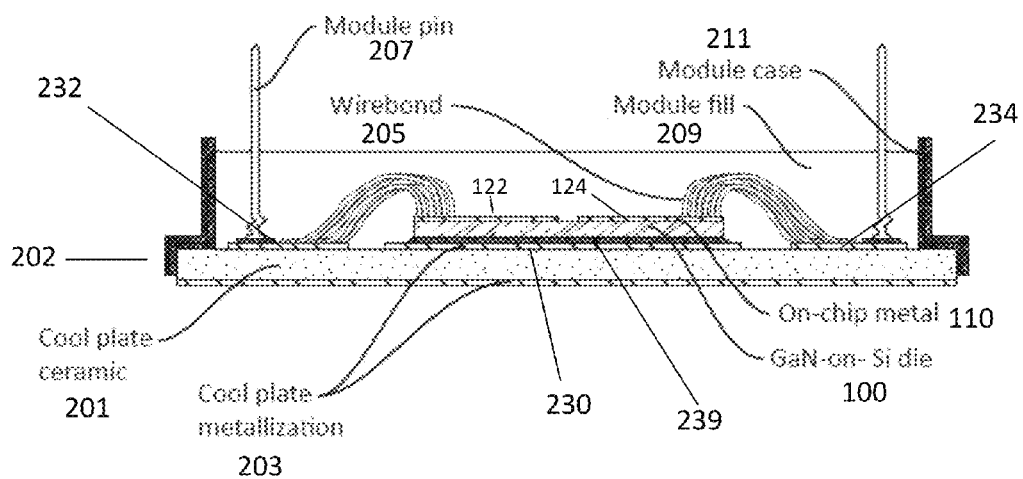
FIG. 4 (Prior Art) shows a packaging arrangement comprising an assembly of a bare GaN die, e.g. a lateral GaN power transistor fabricated on a silicon substrate (Ga-on-Si die), which is wirebonded in a conventional power module.

FIG. 4 (prior art) shows a conventional prior art packaging assembly of a lateral power transistor die 100, mounted on a substrate 202 of a power module and interconnected using wirebonds 205. The power transistor die 100, for example, comprises a lateral GaN power transistor fabricated on a silicon substrate (GaN-on-Si die/GaN die), having metal source, drain and gate contacts on the front-side (top) of the GaN die, such as illustrated in FIG. 3. The substrate 202 comprises a ceramic cool plate 201 (cool plate ceramic) which is metallized on both sides (cool plate metallization) with metal layers 203. The metal on the front-side of the substrate 202 is patterned to define source contact area 232 and drain contact areas 234, near the edges on the front-side (top) of the ceramic plate 201, and a metal pad 230 in the middle of the ceramic substrate 201 is also provided for attaching the GaN-on-Si die 100. The back-side of the GaN-on-Si die is attached to the metal pad 230 of the ceramic substrate 202 using a standard die-attach material, e.g. solder or sintered layer. The source and drain contact areas, 122 and 124, for the GaN transistor are provided by on chip metallization layers (i.e. on-chip metal 110 and/or Cu RDL 120). These contact areas 122 and 124 are wirebonded by multiple wire bonds 205 to respective source and drain metal contact areas 232 and 234 of the ceramic substrate 202 of the module. The die-attach material 239 provides for thermal contact of the GaN die with the ceramic substrate 202 to provide for heat dissipation. Gate connections between the GaN-on-Si die and gate contact areas of ceramic substrate are similarly provided using wirebonds. After the GaN die 100 is mounted on the substrate of the module and wirebonded, the module case 211 is filled with module fill 209, i.e. a suitable dielectric encapsulation material. The module pins 207 provide respective source, drain and gate contacts for the lateral GaN transistor on the GaN-on-Si die 100.

Figures 5A, 5B:
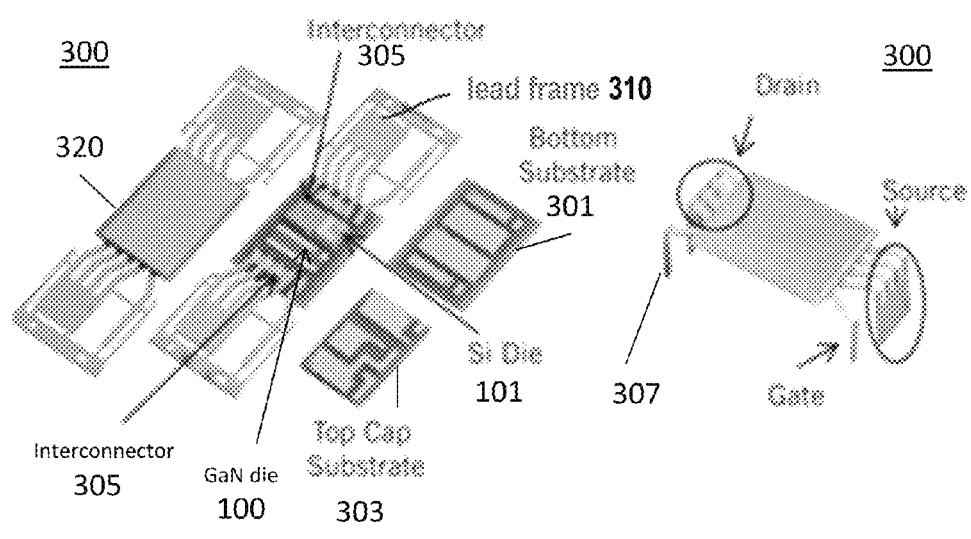
FIGS. 5A and 5B (Prior Art) show views of another arrangement for co-packaging a GaN power transistor die and a silicon die, wherein the two die and leadframe components are sandwiched between and interconnected with metallization of a bottom substrate and a top cap substrate of the package.

FIGS. 5A and 5B (prior art) show schematically another known arrangement for co-packaging a GaN die 100 comprising a normally-on GaN power transistor and a silicon die 101, comprising a driver MOSFET, coupled in cascode configuration, to provide a normally-off switching device. FIG. 5A shows the components comprising the two die, 100 and 101, an interconnector 305 comprising leadframe components 310, and an assembly 320 of the components. The two die are sandwiched between the bottom substrate 301 and a top cap substrate 303 of the package, with interconnectors 305 interconnecting the components with the two leadframe components 310. The top substrate 303 and bottom substrate 301 comprise, for example, a Direct Bonded Copper (DBC) board providing metal contact areas for the GaN die 100 and the Si die 101 and other components. The GaN die and Si die and an interconnector 305 comprising left and right leadframe components 310 are aligned to respective contact areas and sandwiched between the bottom substrate 301 and the top cap substrate 301, thereby electrically interconnecting the components. After the top and bottom substrates have been bonded together the leadframes are trimmed and formed to provide drain, source and gate leads 307 as illustrated in FIG. 5B.

Figure 6A:
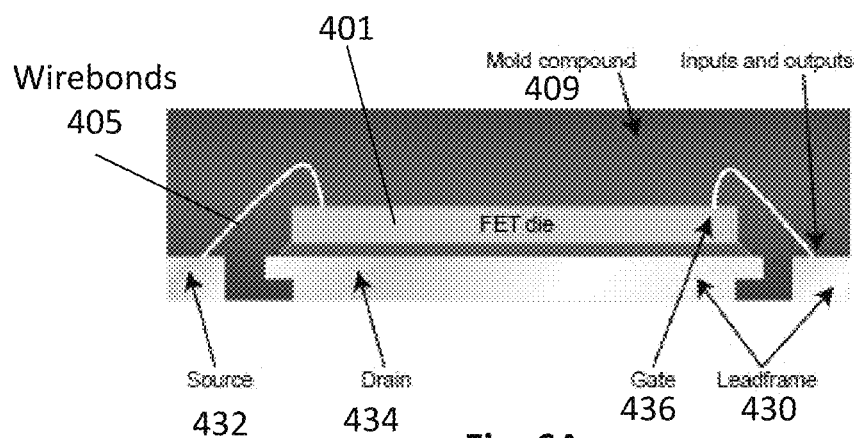
FIGS. 6A and 6B (Prior Art) show views of another packaging arrangement a power transistor die in a PQFN package, wherein the die is wirebonded to the PQFN leadframe.
Figure 6B:
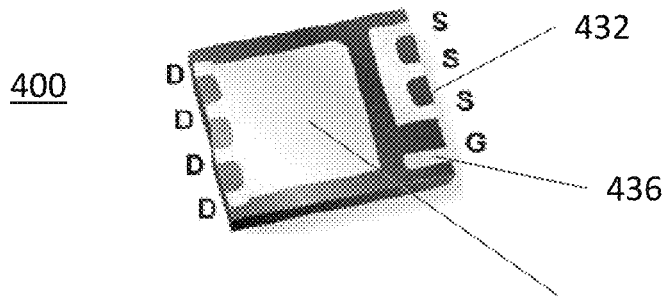

FIGS. 6A and 6B (prior art) show another conventional arrangement for packaging a die 401 comprising a vertical power transistor in a PQFN package 400, wherein the die is wirebonded to the PQFN leadframe 430. The leadframe 430 comprises a large area drain contact area 434, a source contact area 432, and a drain contact area 436. The back-side of the die 401 is attached to the drain contact area 434 with a layer of die attach material, and the source and gate pads on the front-side of the die 401 are interconnected to respective source contact 432 and drain contact 436 of the leadframe 430 with wirebonds 405, as illustrated in the cross-sectional view in FIG. 6A, and encapsulated with mold compound 409. As shown in FIG. 6B, parts of the leadframe providing the respective source, drain and gate contacts pads, i.e. 432, 434 and 436, are exposed on the back-side of the package 400.

Package Scheme A—Leadframe Interposer Sub-Assembly

Figure 7:
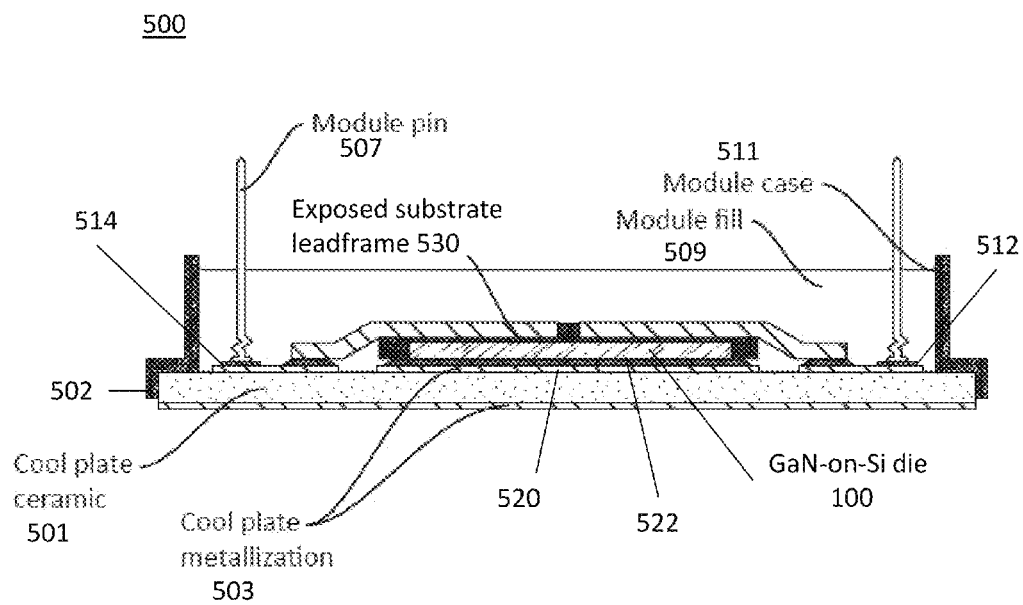
FIG. 7 shows a cross-sectional view of a packaging assembly comprising a lateral GaN die, according to a first embodiment of the present invention.
Figure 8A:
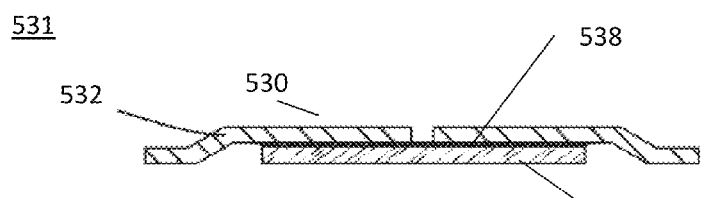
FIGS. 8A and 8B, respectively, show a cross-sectional view of part of the packaging assembly of FIG. 7, comprising an assembly of the GaN die and leadframe (interposer sub-assembly) before and after encapsulation.
Figure 8B:
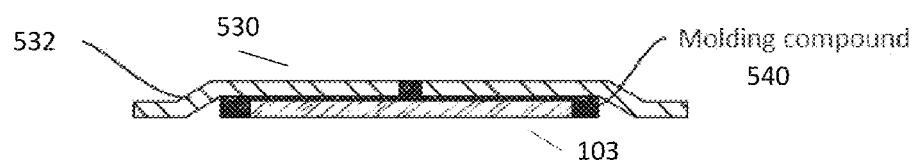

FIG. 7 shows schematically a cross-sectional view of a package assembly of a GaN die 100 and a power module 500, according to an embodiment of the present invention. The module substrate 502 and casing 511 are conventional and comprise a ceramic cool plate 501, substrate metallization layers 503 on both sides of the cool plate, and module pins 507, similar to the respective components shown in FIG. 4. However, a different arrangement is used for electrically interconnecting the GaN die 100 and the module 500, without using wirebonds. The substrate metallization layer 203 on the upper surface of the ceramic cool plate is patterned to define a die attach area 520, a source contact area 512, drain contact area 514, and a gate contact area (not visible in FIG. 7). The GaN die 100 is attached to the metal die-attach pad 520 on the front-side of the substrate 502 for thermal contact, with a die-attach layer 522. An overlying leadframe 530 (labelled exposed substrate leadframe) electrically interconnects the GaN die 100 and the metal contact areas of the substrate 512 and 514 for the source and drain interconnections, respectively. A cross-sectional view of a sub-assembly 531 comprising the GaN die 100 and interposer leadframe 530, which will be referred to an "interposer sub-assembly", is shown in FIG. 8A, with the GaN die 100 being flip-chip attached to the interposer, e.g. using bumps and underfill 538. FIG. 8B shows the interposer sub-assembly 532 after it is partially encapsulated with molding compound 540. That it, the die is only partially encapsulated relative to encapsulation of a conventional PQFN package assembly. The encapsulation leaves the back side 103 of the GaN die 100 exposed, and the leads 532 of the leadframe 530 extend outwardly from the encapsulation 540, as illustrated in FIG. 8B.

Referring back to FIG. 7, the sub-assembly of the GaN die and interposer leadframe is then mounted in a standard power module, and the interposer leadframe provides low inductance electrical connections to the substrate metallization of the power module. The back-side 103 of the GaN die is attached to the substrate using conventional die-attach materials 522. High inductance wirebonds are eliminated, and the assembly requires minimal parts and provides a short thermal path.

Figure 10A:
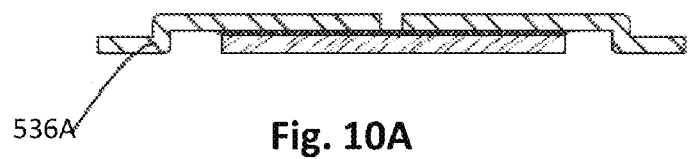
FIGS. 10A, 10B and 10C show cross-sectional views of part of a packaging assembly (interposer sub-assembly) of a GaN die comprising a lateral GaN transistor (lateral GaN die) comprising stamped or formed copper leadframes according to alternative embodiments of the present invention.
Figure 10B:
Figure 10C:
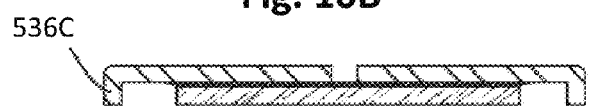

In alternative embodiments, the leadframe may be half-etched, stamped or formed. For example, as illustrated in FIG. 10, a half-etched leadframe 534 is provided, and the lateral GaN die 100 is attached to the leadframe with bumps and under fill 538.

Figure 9:
FIG. 9 shows a cross-sectional view of part of a packaging assembly (interposer sub-assembly) of a GaN die and a half-etched leadframe according to another embodiment.
Figures 11, 12:
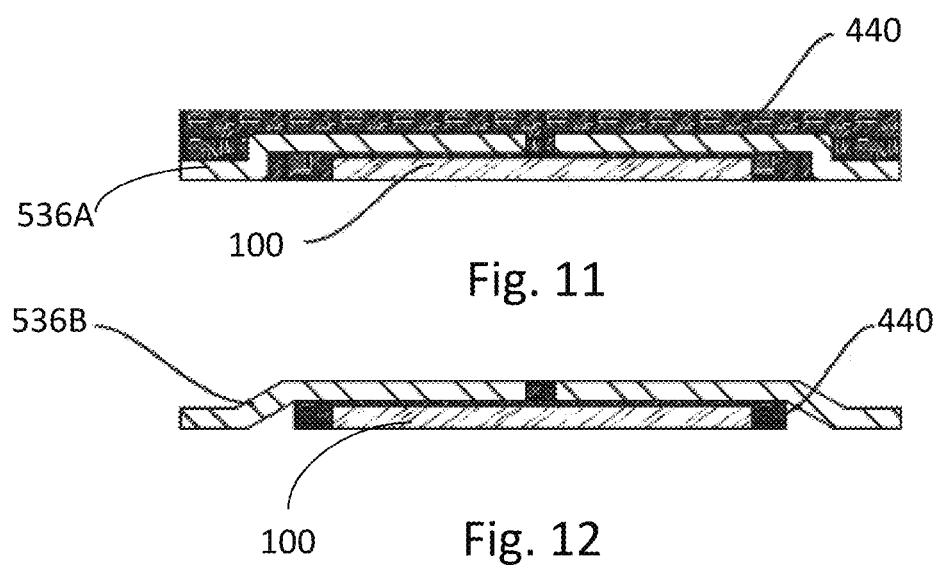
FIG. 11 shows a part of a packaging assembly comprising a lateral GaN die and a leadframe as illustrated in FIG. 10A with an over-molding formed by complete encapsulation.
FIG. 12 shows an assembly of a lateral GaN die and a leadframe as illustrated in FIG. 10B with an over-molding formed by partial encapsulation.

Examples of interposer assemblies of several alternative configurations 536A, 536B and 536C, that can be stamped or formed, are illustrated in FIGS. 9A, 9B and 9C respectively. As illustrated in FIG. 11, an interposer sub-assembly of leadframe 536A (similar to that shown in FIG. 9A) and GaN die 100 may be completely encapsulated with over-molding comprising molding compound 540. Alternatively, an interposer sub-assembly of the leadframe 536B (similar to that shown in FIG. 9B) and GaN die 100 may be partially encapsulated with over-molding 540 as illustrated in FIG. 12. The latter structure may be preferred when the leads 532 of the interposer are flexible.

Figure 13:
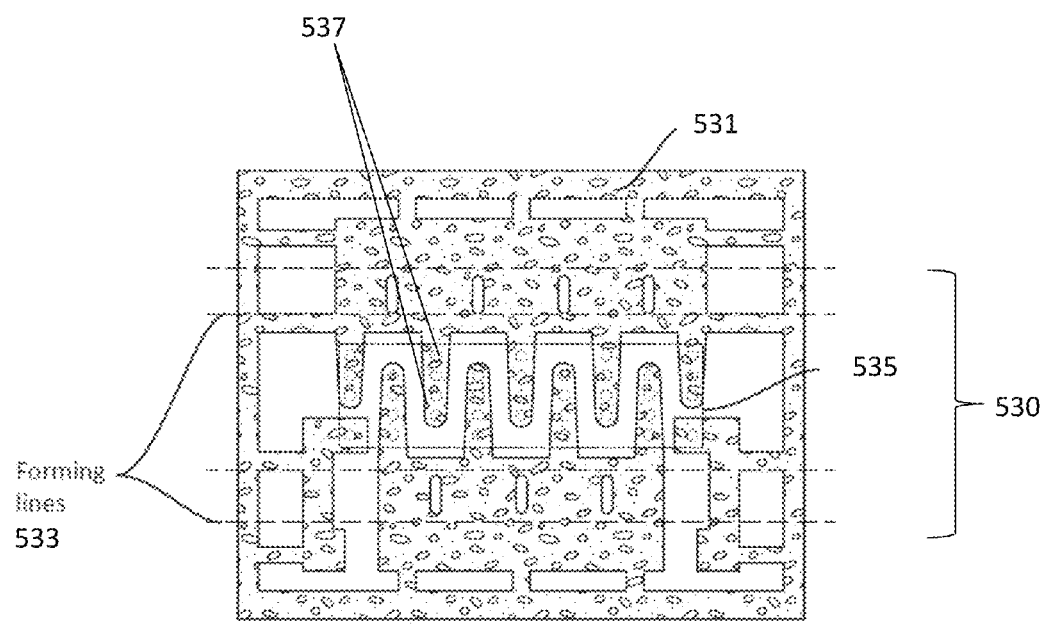
FIG. 13 shows a leadframe structure according to an embodiment of the present invention.
Figure 14:
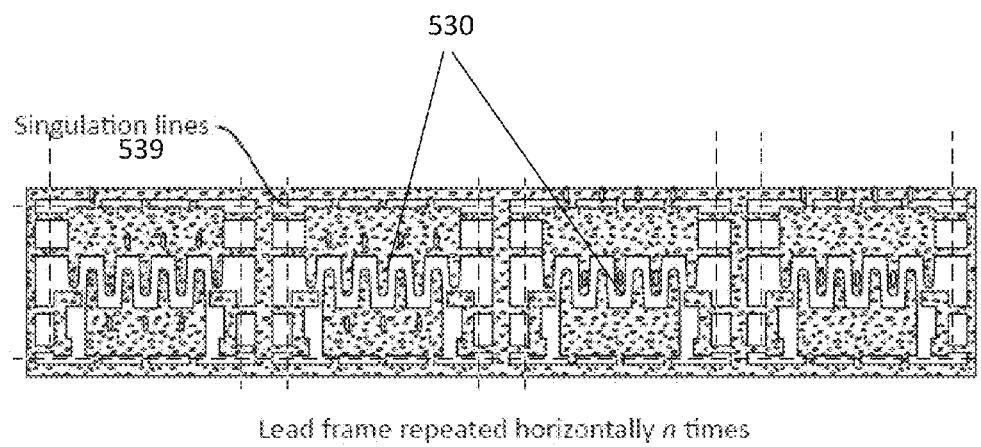
FIG. 14 shows an linear array of a plurality of leadframes, similar to that shown in FIG. 5, prior to singulation.

FIG. 13 shows an example of a leadframe 530 with support frame 531 configured for the GaN die shown in FIG. 3. The leadframe 530, with its support frame 531 is stamped or formed from flat copper stock, by bending along the forming lines (dashed lines) 533 indicated in FIG. 13. The area 535 for attachment of the GaN die is shown in dotted outline, with circles 537 indicating areas for bump connections. FIG. 14 shows a part of a strip of a plurality of n leadframes 530 and support frames 531, similar to the one shown in FIG. 13, fabricated as a linear array of leadframes that are stamped or formed from a copper metal strip. Individual leadframes are formed and singulated during fabrication, along singulation lines 539.

In a method of assembly of the package, contact areas of the GaN die are bumped for placement of bumped lateral GaN power die as indicated by the dotted outline 535 in FIG. 13. The leadframe 530 is patterned from flat stock by a suitable process, e.g. e.g. by stamping to form shape outline and forming to bend the leadframe, along bend lines or forming lines 433, as indicated. Alternatively, the leadframe may be fabricated by to define overall shape outline and then half-etching in place of bending or forming. As shown in FIG. 14, the leadframes may be fabricated as a linear array. However, unlike standard PQFN leadframes, the leadframe must be stamped or formed by bending along the forming lines 533. Thus a linear array, rather than a two dimensional array is preferably used. After forming of the leadframe, the GaN dies are placed and attached, and then encapsulated.

The individual chip and leadframe assemblies are then singulated along the singulation lines 539, as indicated in FIG. 14. The GaN die is attached to the pre-formed leadframe to form the interposer sub-assembly. The interposer sub-assembly is then placed into and attached to the power module. The attach method mechanically bonds and electrically interconnects the GaN die with the power module, using a suitable material, e.g. by soldering or sintering. Metal (solder) bumps and conventional underfill may be used for attaching the GaN die and the leadframe.

Figure 15:
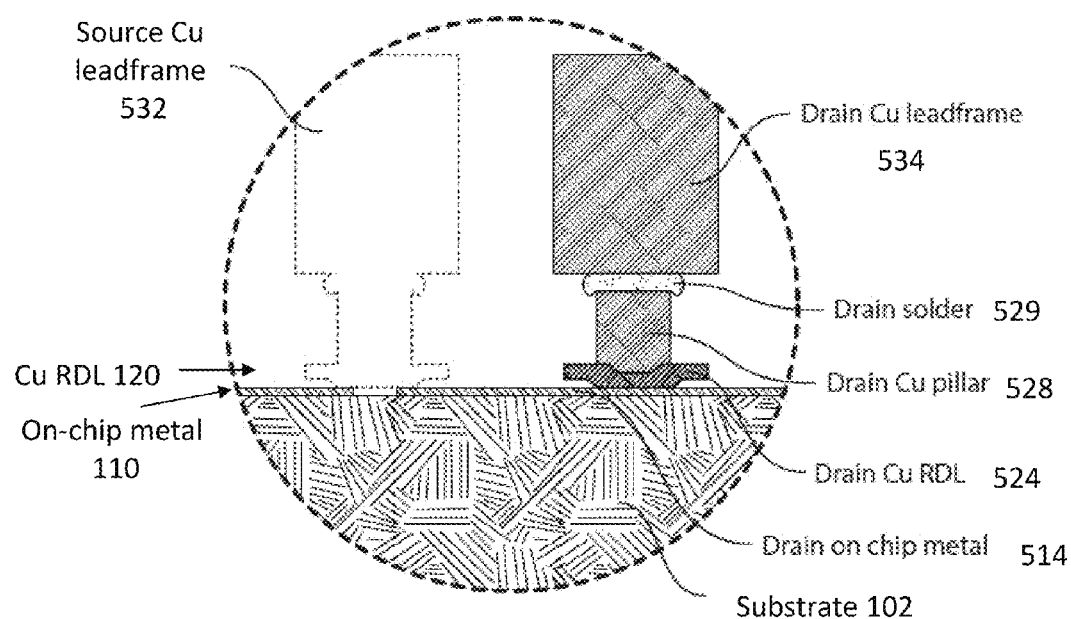
FIG. 15 shows an enlarged schematic cross-sectional view of a drain contact provided by on-chip metal and Cu RDL on the GaN die, as shown in FIG. 2, after further processing to provide a low inductance interconnection comprising a solder tipped copper pillar connecting the drain Cu RDL and a drain copper leadframe portion.

However, a preferred attach method for fabrication of the interposer sub-assembly comprises using solder tipped copper pillars to provide contacts between the GaN die and the leadframe contact areas, as illustrated schematically in FIG. 15. That is, FIG. 15 shows an enlarged view of part of the substrate 102, with an on-chip metal layer defining a drain contact area 114, an overlying drain Cu RDL layer defining a larger area drain contact area 124, a copper pillar 528, with solder tip 529 providing mechanical attachment and electrical interconnection to the overlying drain portion 334 of the leadframe. Source connections to the source portion 532 of the leadframe are similarly structured. After attaching the GaN-on-Si die 100 to the leadframe 530, the interposer sub-assembly 531 is then mounted on the package module to bond the back-side of the GaN-on-Si to the module substrate and also to form electrical connections to the module contact areas for the source, drain and gate interconnections.

Referring back to FIGS. 9 to 12, the different shapes and configurations of the leads of a stamped, formed or half-etched interposer of the various embodiments offer different advantages.

The interposer with double ninety degree bend (FIG. 10A) creates large landing pads, and is easily singulated because leads lie flat on a horizontal surface.

The interposer with single ninety degree leads (FIG. 10C) uses least material, and provides a minimal device footprint.

The interposer with forty-five degree leads (FIGS. 7, 8A, 8B and 10B) can be over-molded with partial encapsulation, so as to provide CTE compliant leads, i.e. leads provide sufficient flexibility to accommodate CTE mismatch between the GaN die and the substrate of the power module, as illustrated in FIG. 12.

For over-molding, complete encapsulation, as shown in FIG. 11, is easy to manufacture and robust. Partial encapsulation, as shown in FIG. 12, exposes leads to allow for compliance/flexibility that assists in reducing CTE mismatch.

In case of a half-etched leadframe, fabrication using a two dimensional array of a plurality of leadframes is preferred.

The resulting packages can be fabricated with a conventional PQFN technology/process flow. However, a conventional PQFN package is intended to provide completed encapsulated package for attachment to a PCB, i.e. a PQFN which physically protects the die as much as possible. In contrast, a module according to the embodiment shown in FIG. 7 provides a sub-assembly wherein the bottom/substrate of the GaN die is exposed. This structure is cheaper to fabricate, because there are fewer parts, i.e. no wire bonds, no clips, and the package is thinner. This structure provides a better, more direct, thermal path to a thermal pad or substrate. Overall, this structure offers better performance with respect to improved current handling, and reduced inductance relative to a wirebonded structure.

Package Scheme B: High Current Leadframe/Ceramic Interposer Sub-Assembly

Figure 16:
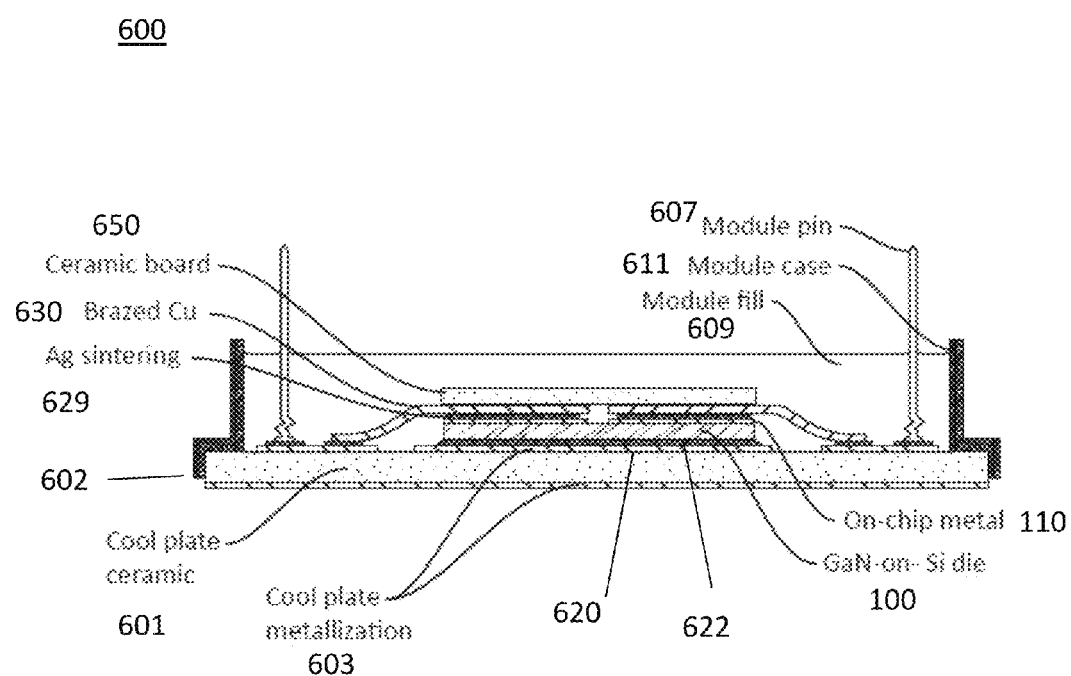
FIG. 16 shows a packaging assembly comprising a lateral GaN die and packaging components according to a second embodiment, configured for high-current applications.

FIG. 16 shows a schematic cross-sectional view of a package assembly of a GaN die 100 and a power module 600 according to a second embodiment of the present invention. The module substrate 602 and casing 611 are conventional and comprise a ceramic cool plate 601, substrate metallization 603 on both sides of the cool plate, and module pins 607, similar to the respective components shown in FIG. 7. However, it uses a different form of interposer sub-assembly for electrically interconnecting the GaN die 100 and the module 600, without using wirebonds. As in the first embodiment, the GaN die is attached to a metal pad 620 on the front-side of the substrate for thermal contact, using a suitable die attach material 622. However, the interposer sub-assembly, as illustrated schematically in FIGS. 17 and 18, comprises a ceramic substrate board 650 to which brazed copper leads 630 are bonded. Metal contact areas of the GaN die 100 are then mechanically bonded and electrically interconnected to respective contact areas of on-chip metal of the GaN die using silver (Ag) sintering 629 to the patterned brazed copper 630. In this embodiment, the attachment using Ag sintering is used in contrast to metal bumps and conventional underfill, or solder tipped copper pillars used in the first embodiment shown in FIG. 7. However, in variants of this embodiment, copper pillars may be preferred to provide low inductance interconnections.

For example, attachment of the copper leads to the ceramic board may be made by AMB active metal brazing or other suitable method. AMB involves applying a pattern of the brazing material on the ceramic substrate, placing the copper layer on the substrate and brazing at 800° C., and then etching away excess copper.

Figure 17:
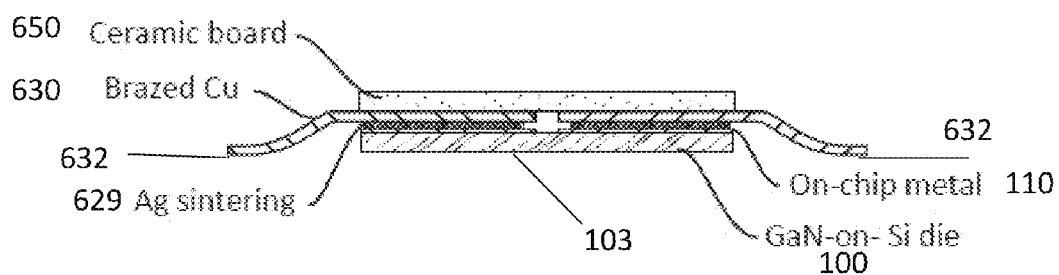
FIG. 17 shows a part of the packaging assembly (interposer sub-assembly) of FIG. 16 comprising a lateral GaN die according to the second embodiment.
Figure 18:
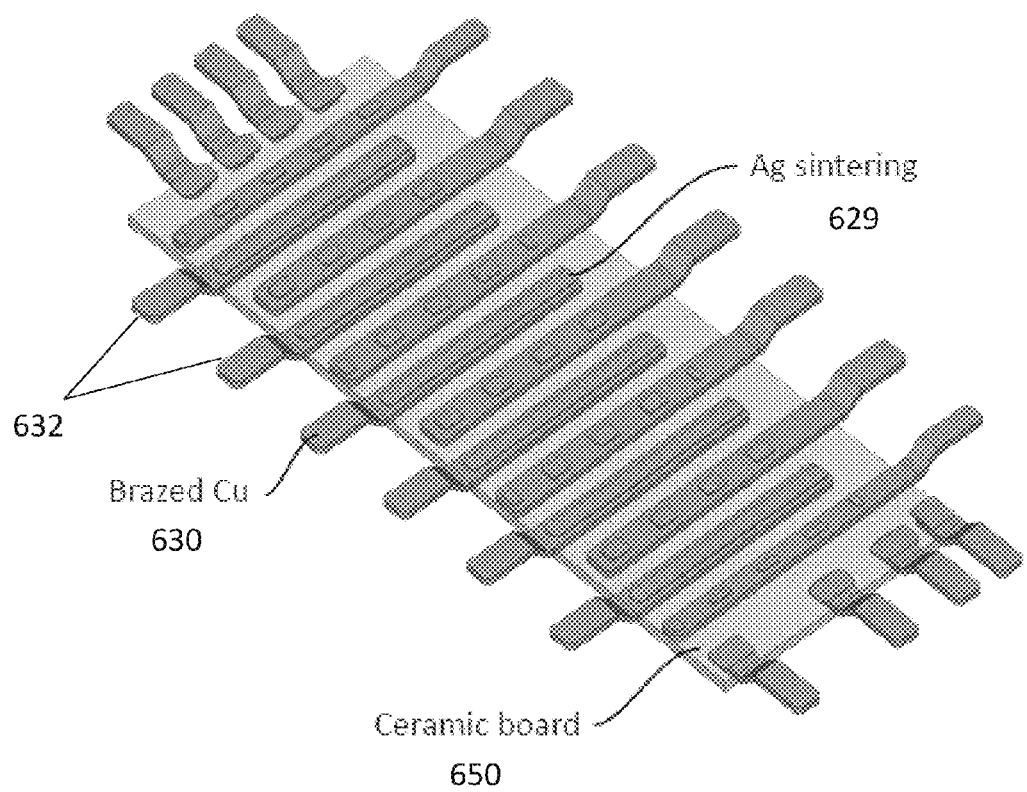
FIG. 18 shows a perspective view of the back-side of the interposer of FIGS. 15 and 16; showing silver sinter areas for attachment of the GaN die.

As illustrated in FIGS. 17 and 18, the brazed Cu layer 630 extends beyond edges of the ceramic board 650, and is formed into lead like structures that bend down and then flatten out at the same level as the back-side of the die. The resulting structure presents co-planar contact areas 632 for all top side I/Os, for the source drain and gate, as well as for the substrate/thermal side 103 of the die. The co-planar contacts 632 can be easily mounted to patterned metallization of the ceramic cooling plate of the power module with a suitable attachment material, such as solder.

The interposer sub-assembly interfaces between the fine-pitched on-chip pad arrangement of a high-current lateral GaN HEMT and the coarse-patterned metallization of a power module cooling plate. The interposer interconnects the pad I/Os of the power module cooling plate vertically from one level (top of the die) to another (cooling plate metallization).

A packaging assembly of this structure enables efficient all ceramic packaging of large format high-current lateral GaN HEMT die.

Figure 19:
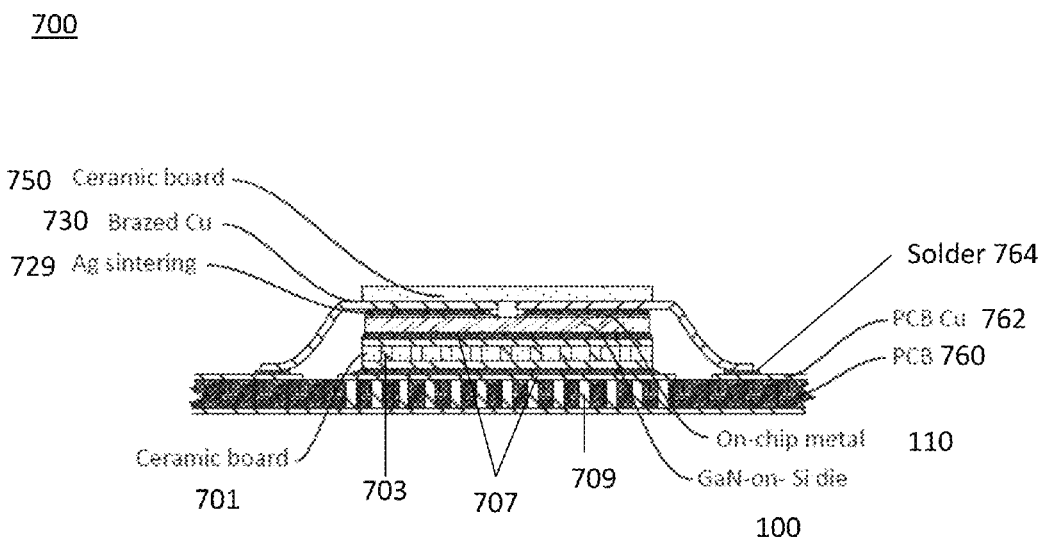
FIG. 19 shows a packaging assembly comprising a lateral GaN die and packaging components according to a third embodiment, configured for high current applications.

FIG. 19 shows schematically a cross-sectional view of a package assembly 700 comprising a GaN die 100, a thermal spreading board 701 and Printed Circuit Board (PCB) 760, according to a third embodiment of the present invention. The interposer sub-assembly of this packaging assembly, comprising a ceramic board 750, brazed copper leads 730 and silver sintering 729 for die-attach of the GaN die 100, is similar to that shown in FIG. 17, but instead of being mounted inside a power module, it is mounted on the PCB 760 with the ceramic thermal spreading board 701 (labelled ceramic board) between the GaN die 100 and the PCB 760. Optionally, the ceramic board 701 may comprise thermal vias 703, as illustrated, depending on whether or not a source connection is available on the top of the die.

Compared to the structure shown in FIG. 17, the leads 730 of the leadframe are longer, and extend laterally and vertically, downwards, from the ceramic board 750 to accommodate the additional thickness of the ceramic board 701 between the GaN die 100 and the PCB 760. Dielectric filling 707 is placed between interposer sub-assembly and thermal board, creating a solid and sealed unit. The interposer sub-assembly and ceramic board may be mounted on a PCB or other suitable substrate, which preferably provides for heat dissipation, e.g. using copper thermal vias 709.

Alternative Embodiments

While several embodiments have been described in detail, with reference to a GaN die such as illustrated in FIG. 3, it will be appreciated that variations and modifications may be made to these embodiments.

The leadframe may comprise copper or a copper alloy. Alternatively it may comprise other suitable metals and metal alloys, or composites, which are typically used for semiconductor packaging components, providing they have sufficient current capability and thermal conductivity, and an appropriate CTE.

Sintered silver is preferred as a low inductance, and thermally conductive die-attach material, to provide both an electrical connection and thermal connection of the backside of the GaN die and the second copper leadframe layer comprising the thermal pad and source clip. Alternatives to sintered silver comprise, for example, silver impregnated epoxy, lead free solder, or similar die-attach materials.

Electrical connections between the source, drain and gate contact areas of the GaN die to the respective source, drain and gate portions of first copper leadframe layer, are preferably metal bump or post connections using interconnect materials that are excellent electrical conductors, capable of withstanding power cycling, and where possible, are lead-free. Sintered silver provides excellent electrical conductivity and is also an excellent thermal conductor. Solder tipped copper pillars are preferred. For soldered connections, lead-free solder is preferred. A plurality of copper bumps, posts or pillars may be formed integrally with the first copper leadframe layer, e.g. by a half-etch process. Contacts between bumps or posts of a half-etched leadframe and on-chip metal/Cu-RDL source, drain and gate contacts may be made using some form of solder. Other suitable conventional metal bump and post connections may be used.

Typically, the die is first attached to the die-attach area of the first leadframe layer e.g. using the selected die-attach material and process, e.g. using silver sintering or solder reflow. The interconnect material for the second leadframe layer is printed, patterned or otherwise attached (e.g. by solder reflow/cure) to the second leadframe layer. Then the second leadframe layer with the patterned layer of interconnect material or e.g. an array of posts/pillars is placed on the die aligned to respective source, drain and gate contact areas.

During reflow or curing of attach/interconnect, using materials such as solder or conductive epoxy, the material tends to center itself in the opening of the contact area or plated area for each pillar of the leadframe, thus there is some self-centering during this process.

For encapsulation, a small/fine grained over-molding compound, e.g. <25 μm grain size, is required to get in between the plurality of copper pillars and under the GaN die. Currently, this is an unusually small grain size for an over-molding/encapsulation compound for regular PQFN package manufacturing.

Performance Considerations

Device structures according to preferred embodiments adapt elements of PQFN technology for packaging GaN die comprising lateral GaN power transistors, where all source, drain and gate contact areas are provided on one side of the GaN die, without wirebonding. In particular, the resulting package assembly can be configured for GaN switching devices comprising lateral GaN power transistor, including high current/high voltage switches, where low inductance interconnections and effective thermal dissipation are required. For example, whereas a 25 µm gold bond wire may have an inductance of ~1 nH/mm, a copper pillar of diameter from 50 µm to 100 µm, and a height of 200 µm, has been reported to have inductance of ~100 pH (Ate He, et al., J. Electrochem. Soc. 155(4) D314-D322 (2008)).

For thermal dissipation, the dual leadframe package assembly can be configured for either front-side or back-side cooling, and thus the first and second leadframe layers preferably comprise copper, copper alloys or other metals and/or metal alloys, comprising e.g. copper, silver and gold, or composites, having both high electrical conductivity and high thermal conductivity.

Embodiments of the packaging assemblies described herein may be adapted for GaN dies comprising lateral GaN devices with alternative layouts. Other layouts comprising single or multiple external pads for source, drain and gate connections may be provided, or an additional contact pad, e.g. for a source sense (Kelvin) connection may be provided.

In other embodiments, for example, for GaN power systems, GaN die comprising one or more lateral GaN power transistors and/or diodes may be co-packaged with one module or on a common substrate, and/or a GaN die comprising a lateral GaN power transistor may be co-packaged with other components such as driver circuitry. The lateral GaN power device or systems may comprise integrated driver circuitry.

The power module may comprise a ceramic multi-chip module or other standard power module. The ceramic substrate of the module may comprise Direct Bonded Copper (DBC) or Direct Plated Copper (DPC) metallization.

While preferred materials and methods for die-attach of the lateral GaN die to the interposer sub-assembly and for attachment of the GaN die to a substrate, comprising a power module or a PCB are disclosed, other suitable attachment materials and methods may be used for mechanical bonding and electrical connection of the components. For thermal management, various suitable ceramic materials may be used for the module substrate or other ceramic boards which provide for heat dissipation In an alternative embodiment, the brazed copper leads can be bent the other way, i.e. the other way up and the device sub-assembly flipped over, relative to the arrangement shown in FIG. 18. In this configuration, the GaN die can be cooled from the other side (i.e. "top-side" cooled).

Packaging assemblies for lateral GaN power devices and systems according to embodiments disclosed herein can carry an increased current relative to conventional wirebonded packages, such as shown in FIG. 4, while reducing inductance. The package can be fabricated at lower cost and with a lower profile (thinner) than conventional wirebonded arrangements.

In some embodiments, the use of thick copper RDL for large area, low inductance on-chip source and drain contacts is preferred. The use flip-chip assembly with copper posts to provide low inductance interconnections provides some compliance that assists with relief of CTE mismatch between GaN die and Cu leadframe. The CTE of the exposed Si substrate is better matched to that of the copper leadframe of the package.

For comparison, referring to the example of a conventional PQFN package is shown in FIGS. 6A and 6B, As illustrated in FIG. 6A, the package 400 for FET die 401 comprises a leadframe 430 comprising a thick copper die pad 434 on which the FET die is mounted with die attach layer 422. The pad 434 also acts as a drain contact pad. The leadframe 430 also provides a source pad 432 and a gate pad 436. Wirebonds 405 connect the source of the FET die to the source pad 432 of the package and connect the gate of the FET die to the gate pad 436 of the package. Thus the package must be thick enough to accommodate the wirebonds. A conventional thick copper die pad 434 as used in a standard PQFN package, such as illustrated in FIGS. 6A and 6B, can introduce significant thermal impedance.

Structures according to embodiments of the invention can provide more direct thermal contact between the lateral GaN die and a thermal substrate, which reduces thermal impedance (i.e. provides shorter thermal path) and improves device performance. The resulting package can also be made more compact in the vertical dimension (i.e. low profile) compared to conventional wirebonded solutions. Use of the interposer sub-assembly requires fewer parts and less expensive parts than a standard PQFN package. Also, the fabrication and assembly process can be streamlined since the die is mounted to the substrate cooling plate and electrically connected vertically in a single process step. This solution eliminates wirebonding and provides a compromise between a fully encapsulated standard PQFN package and a bare die, wirebonded solution in a standard power module.

Although embodiments of the invention have been described and illustrated in detail, it is to be clearly understood that the same is by way of illustration and example only and not to be taken by way of limitation, the scope of the present invention being limited only by the appended claims.

The invention claimed is:

1. A semiconductor device structure comprising an assembly of:
   a lateral GaN power transistor fabricated on a semiconductor substrate (GaN die) and packaging components comprising a leadframe and a substrate;
   the GaN die comprising a front surface providing source, drain and gate contact areas for the lateral GaN power transistor and a back surface for die-attach;
   the leadframe comprising copper, or other metal or metal alloy, having high electrical conductivity and thermal conductivity, the leadframe being patterned to provide source, drain and gate portions corresponding to source, drain and gate contact areas on the front surface of the GaN die;
   the source, drain and gate contact areas of the GaN die being attached and electrically connected to respective source, drain and gate portions of one side of the leadframe by low inductance connections to form an interposer sub-assembly;
   source, drain and gate leads of the leadframe extending laterally and vertically from the GaN die to provide source, drain and gate contact surfaces, coplanar with the die-attach surface of the GaN die, for electrical interconnections to respective coplanar contact areas of the substrate; and
   the die-attach between the back-side surface of the GaN die and the respective source, drain and gate interconnections comprising a layer of interconnect material which is electrically and thermally conductive.

2. The device of claim 1, wherein the substrate comprises a ceramic substrate of a power module for thermal dissipation, the ceramic substrate being metallized on both sides to provide coplanar source, drain and gate contact areas on one side, and a die attach area on said one side being co-planar with said contact areas.

3. The device structure of claim 1, wherein the substrate comprises a Printed Circuit Board (PCB) providing coplanar source, drain and gate contact areas and a die-attach area of the PCB which is coplanar with said contact areas, and wherein the die-attach area of the PCB provides for thermal dissipation.

4. The device structure of claim 1, wherein the semiconductor substrate of the GaN die comprises a silicon substrate.

5. The device structure of claim 1, wherein the semiconductor substrate of the GaN die comprises a silicon carbide substrate.

6. The device structure of claim 1, wherein the low inductance connections comprise any one of:
   a layer of sintered silver;
   metal bump or post connections;
   solder tipped copper pillars; and
   a combination thereof.

7. The device structure of claim 1, wherein the back surface of the GaN die is attached to the die-attach area of the substrate by sintered silver.

8. The device structure of claim 1, wherein the back surface of the GaN die is attached to the die-attach area of the substrate by solder and the source, drain and gate interconnections from the leadframe to the substrate comprise solder.

9. The device structure of claim 1, wherein the interposer sub-assembly comprises the GaN die and leadframe and further comprises a thermal dissipation layer.

10. The device structure of claim 9, wherein the GaN die is attached to said one side of the leadframe and the thermal dissipation layer comprises a ceramic substrate attached to an opposite side of the leadframe.

11. The device structure of claim 10, wherein the ceramic substrate supports a plurality of leadframe components providing individual source, drain and gate leads.

12. The device structure of claim 1, further comprising a second lateral GaN die or other semiconductor die co-packaged and electrically interconnected with the said GaN die.

13. An interposer sub-assembly of a GaN die and a leadframe for the device structure of claim 1, wherein the GaN die is electrically connected to contact areas on one side of the leadframe, and the leadframe provides source, drain and gate contact areas coplanar with a back-side die-attach surface of the GaN die.

14. An interposer sub-assembly of a GaN die, a leadframe and a thermal substrate, for the device structure of claim 1, wherein the leadframe is sandwiched between the GaN die and the thermal substrate, the GaN die being electrically connected to contact areas on one side of the leadframe and the thermal substrate being bonded to an opposite side of the leadframe for thermal dissipation and the leadframe provides source, drain and gate contact areas coplanar with a back-side die-attach surface of the GaN die.

15. The interposer sub-assembly of claim 14, wherein the leadframe comprises brazed copper and the thermal substrate comprises a ceramic thermal substrate bonded to the brazed copper leadframe, and the GaN die-attach is electrically and thermally bonded to the leadframe by a sintered silver layer.

16. The interposer sub-assembly of claim 15, wherein a second thermal substrate is bonded to the back surface of the GaN die and the second thermal substrate provides said die-attach surface of the GaN die.

17. A method of fabricating a semiconductor device structure comprising an assembly of a lateral GaN power transistor fabricated on a semiconductor substrate (GaN die) and packaging components comprising a leadframe and a substrate, the method comprising:
   providing the GaN die comprising, on a front surface thereof, source, drain and gate contact areas for the lateral GaN power transistor and a back surface thereof for die-attach;
   providing the leadframe of copper, or another metal or metal alloy having a high electrical conductivity, the leadframe being patterned to provide source, drain and gate portions corresponding to source, drain and gate contact areas on the front surface of the GaN die;
   attaching the source, drain and gate contact areas of the GaN die with electrical interconnections connected to respective source, drain and gate portions of one side of the copper leadframe, comprising low inductance bump or post connections, to form an interposer sub-assembly;
   source, drain and gate leads of the leadframe extending laterally and vertically of the GaN die to provide source, drain and gate leads providing contact surfaces coplanar with the die-attach surface of the GaN die for electrical interconnection to respective coplanar contact areas of the substrate; and
   providing a layer of soldered or sintered material which is electrically and thermally conductive to attach the back-side surface of the GaN die to the die-attach area of the substrate, and to electrically interconnect the respective source, drain and gate interconnections of the leadframe and substrate contact areas.

18. The method of claim 17, comprising processing the bump or post connections and the attachment material to vertically attach, and thermally and electrically interconnect the source, drain and gate contact areas of the GaN die and respective source, drain and gate portions.

19. The method of claim 17, further comprising providing a package body comprising an over-molding of encapsulation.

* * * * *